(12) United States Patent
Macpherson

(10) Patent No.: US 6,822,824 B2
(45) Date of Patent: Nov. 23, 2004

(54) FLEX CIRCUIT BRACKET WHICH ESTABLISHES A DIFFUSION PATH FOR A DATA STORAGE DEVICE HOUSING

(75) Inventor: Aaron S. Macpherson, Fort Collins, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 167 days.

(21) Appl. No.: 10/290,911

(22) Filed: Nov. 8, 2002

(65) Prior Publication Data

US 2003/0227711 A1 Dec. 11, 2003

Related U.S. Application Data

(60) Provisional application No. 60/386,923, filed on Jun. 7, 2002.

(51) Int. Cl.[7] ................................................ G11B 33/14
(52) U.S. Cl. .................................................... 360/97.01
(58) Field of Search .......................... 360/97.01, 97.02, 360/97.03, 97.04, 98.01, 245.9

(56) References Cited

U.S. PATENT DOCUMENTS

| | | |
|---|---|---|
| 4,620,248 A | 10/1986 | Gitzendanner |
| 5,025,336 A | 6/1991 | Morehouse et al. |
| 5,029,026 A | 7/1991 | Stefansky et al. |
| 5,124,856 A | 6/1992 | Brown et al. |
| RE34,497 E | 1/1994 | Blanks |
| 5,307,222 A | 4/1994 | Dion |
| 5,417,743 A | 5/1995 | Dauber |
| 5,593,482 A | 1/1997 | Dauber et al. |
| 5,754,366 A | 5/1998 | Yoshino |
| 5,760,997 A * | 6/1998 | Koyanagi et al. ........ 360/97.01 |
| 5,764,435 A | 6/1998 | Sugimoto et al. |
| 5,872,680 A | 2/1999 | Patterson et al. |
| 5,877,915 A | 3/1999 | Ishida |
| 5,997,614 A | 12/1999 | Tuma et al. |
| 6,008,966 A | 12/1999 | Forbord et al. |
| 6,088,190 A | 7/2000 | Anderson |
| 6,128,159 A | 10/2000 | Ino |
| 6,144,522 A | 11/2000 | Myokan et al. |
| 6,208,484 B1 | 3/2001 | Voights |
| 6,266,208 B1 | 7/2001 | Voights |
| 2002/0075590 A1 | 6/2002 | Garikipati et al. |
| 2002/0089781 A1 | 7/2002 | Tuma |
| 2003/0169531 A1 * | 9/2003 | Wang et al. ............. 360/97.02 |

FOREIGN PATENT DOCUMENTS

JP    62-279588 A    12/1987

* cited by examiner

Primary Examiner—David Ometz
(74) Attorney, Agent, or Firm—Fellers, Snider, et al.

(57) ABSTRACT

A flex circuit bracket for use in a data storage device housing and a method of fabrication therefor. The flex circuit bracket supports a flex circuit assembly and establishes a diffusion path between the housing interior and an external environment. A rigid plate has a diffusion path and opposing exterior and interior surfaces. A laminated flex circuit embeds a number of conductive traces and includes a web portion and an extended portion. The web portion is affixed to the exterior surface of the plate to form the diffusion path. An additional plate can be provided so that the web portion is affixed to the exterior surfaces of both plates and folded to establish the diffusion path. A connector is preferably affixed to the web portion, and the bracket is mounted to the housing so that the connector extends through a bulkhead aperture and mates with a printed circuit board.

20 Claims, 6 Drawing Sheets

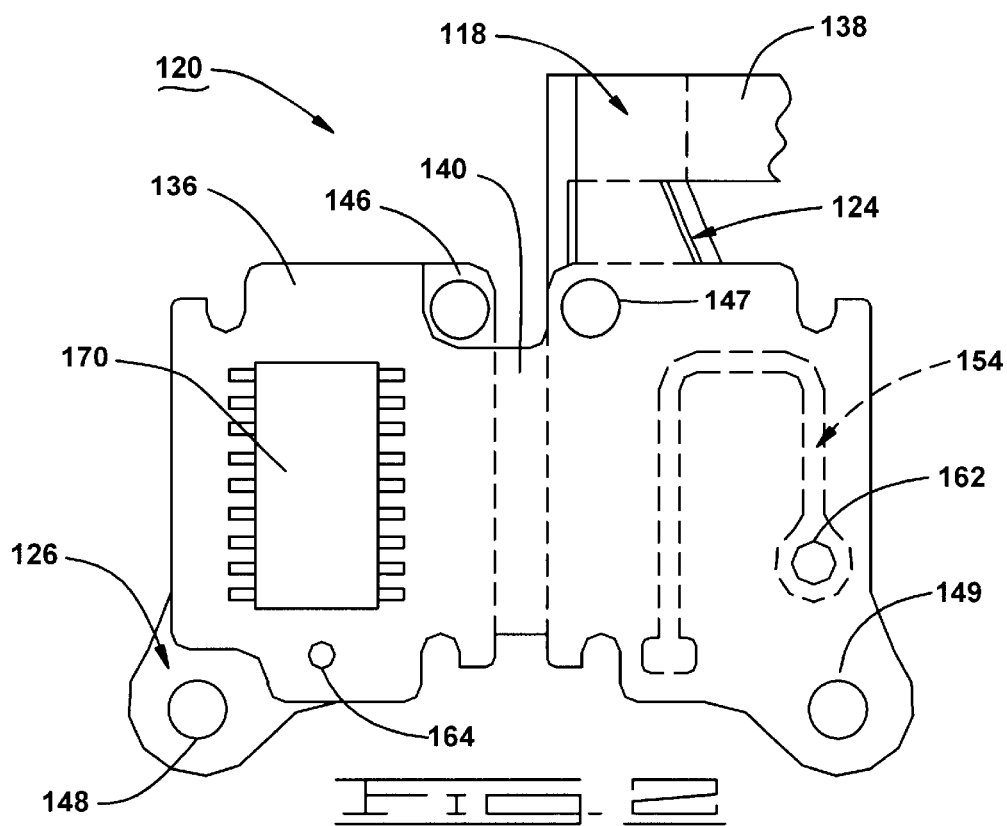
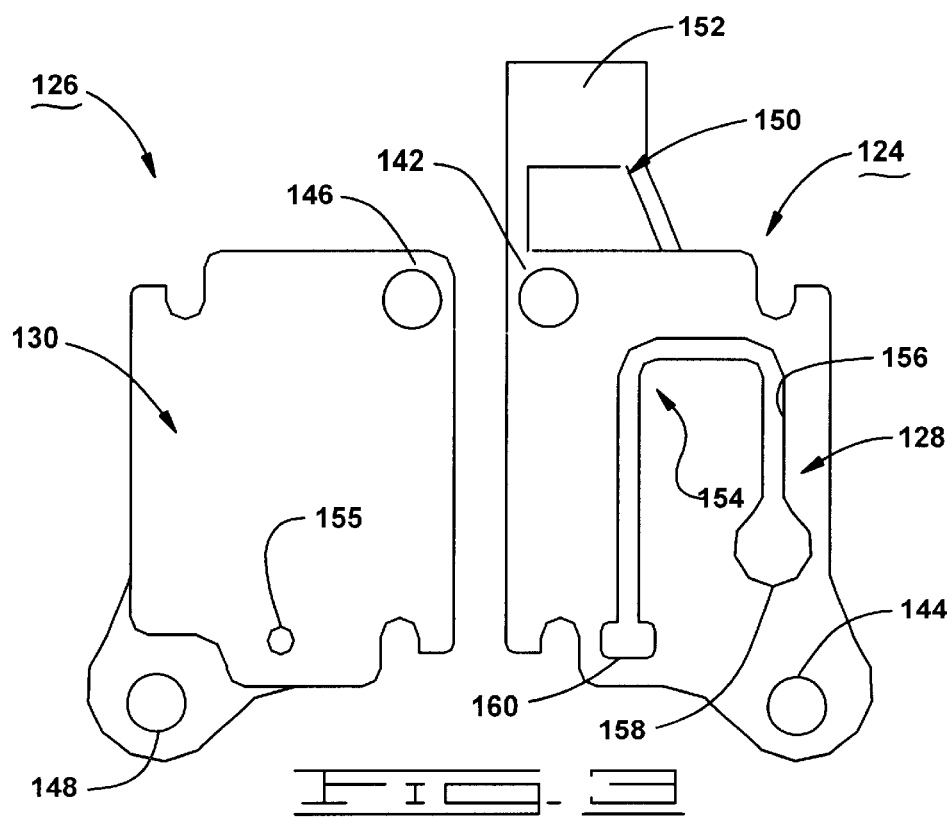

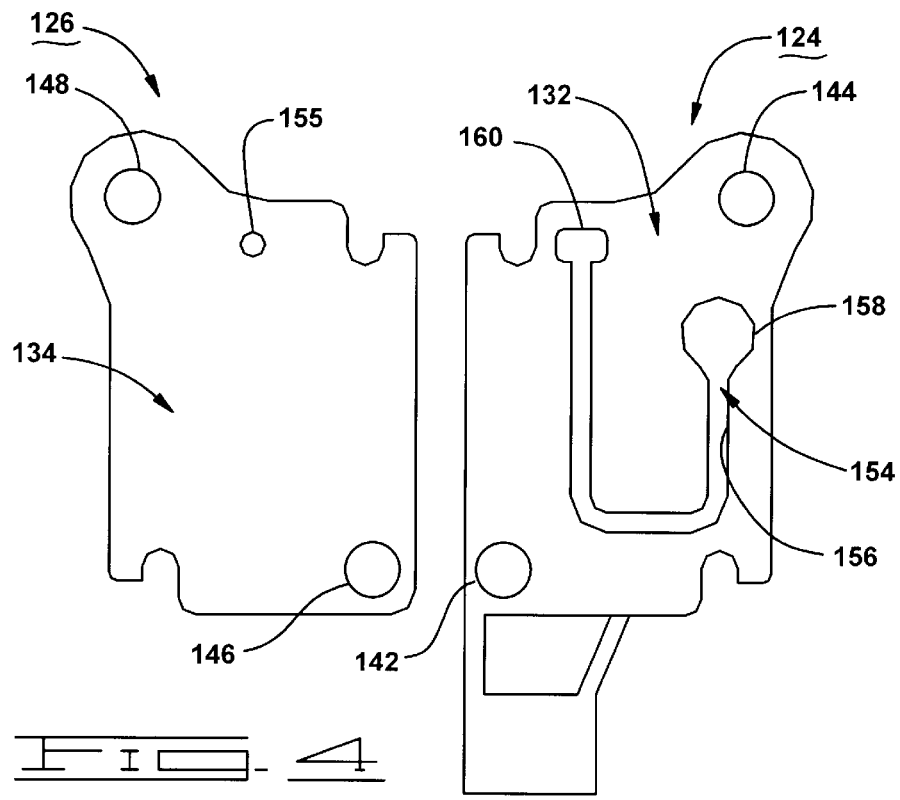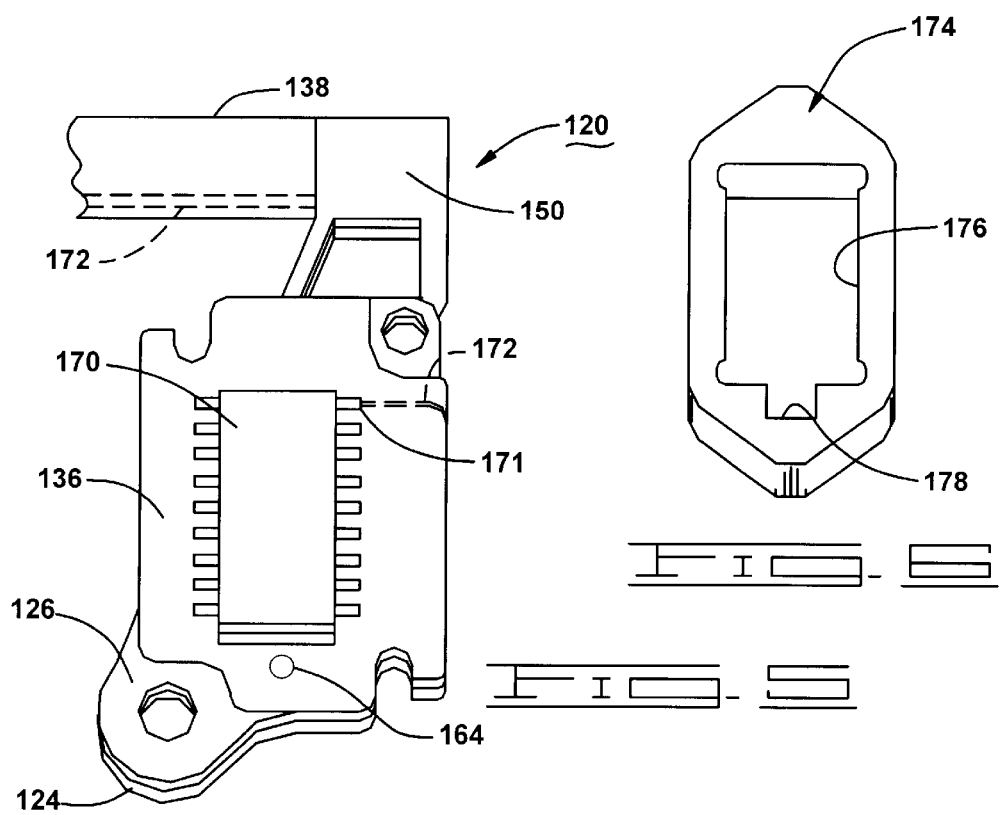

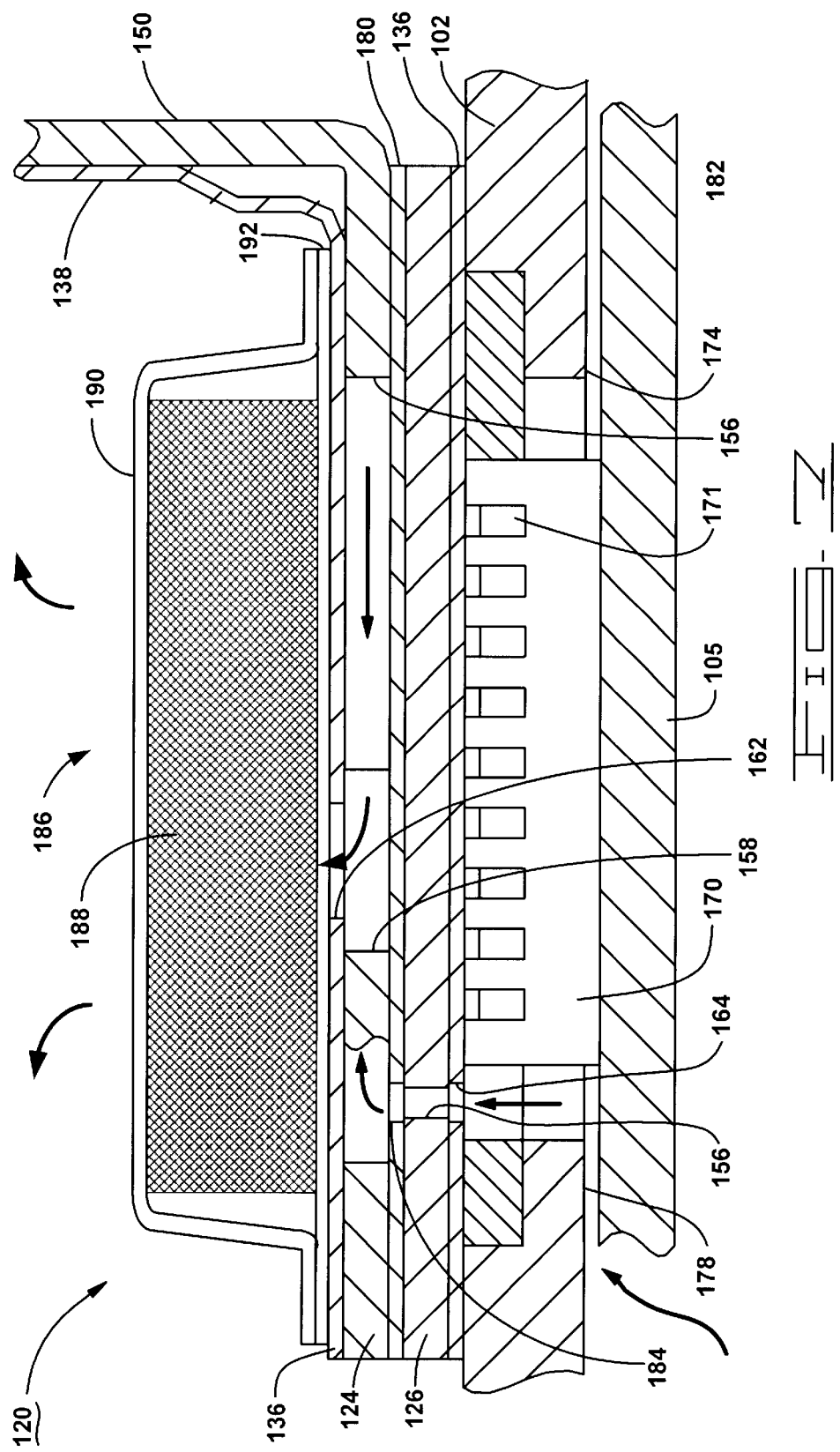

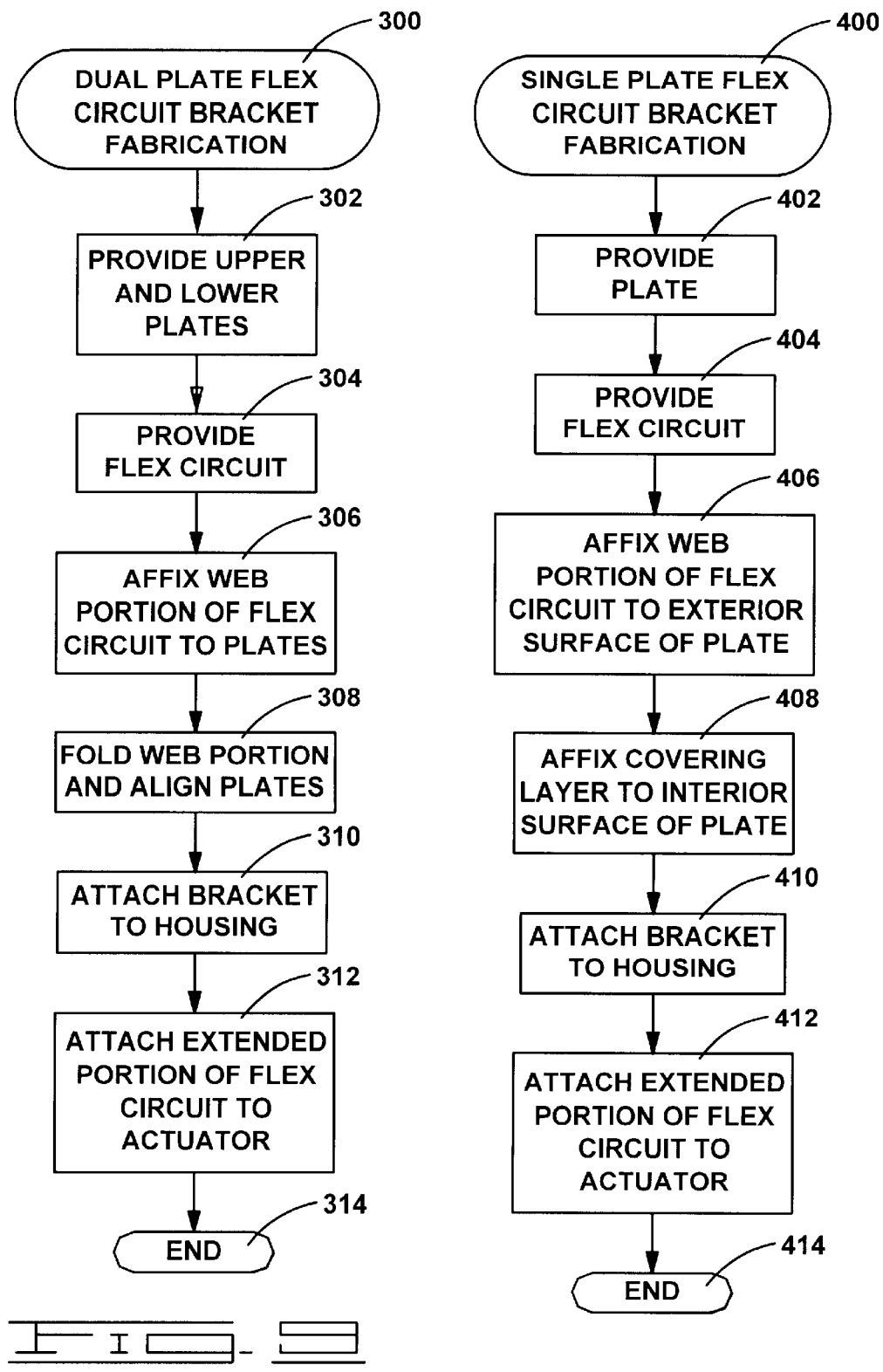

FLEX CIRCUIT BRACKET WHICH ESTABLISHES A DIFFUSION PATH FOR A DATA STORAGE DEVICE HOUSING

RELATED APPLICATIONS

This application claims domestic priority under 35 U.S.C. §119(e) to U.S. Provisional Application No. 60/386,923 filed Jun. 7, 2002.

FIELD OF THE INVENTION

The claimed invention relates generally to data storage devices and more particularly, but not by way of limitation, to minimizing the ingress of atmospheric contaminants within a data storage device housing.

BACKGROUND

Digital data storage devices, such as disc drives, are used in computer based systems to store and retrieve large amounts of user data. A typical data storage device includes an environmentally controlled housing in which one or more data recording discs are rotated during operation.

Data are written to and retrieved from the discs by a corresponding number of data transducing heads supported by a moveable actuator. Control electronics for the device are typically supported on a printed circuit board (PCB) mounted to an exterior surface of the housing. A flex circuit assembly projects through the housing to establish the requisite communication paths between the actuator and the PCB and to facilitate movement of the actuator within the housing.

It is desirable to minimize the presence of particulate contamination within a data storage device housing, as such contamination can adversely affect data storage, transfer performance and reliability. Data storage housings are typically sealed using gaskets and similar features to prevent the ingress of atmospheric contaminants.

It is difficult and cost prohibitive to completely seal a drive to prevent air infiltration. A desirable approach is to design in a leak with appropriate filtration such that, for practical purposes, all of the air transports through a known leak path.

A diffusion path is typically formed through a housing wall and provides a elongated, narrow channel which permits fluidic flow and lessens the mass transport per unit time due to diffusion. Filters are incorporated at the end of diffusion paths to further adsorb contaminants and prevent the ingress of such contaminants into the housing.

With continued demand for higher performance, lower cost data storage devices, there remains a continual need for improved approaches to controlling the ingress of particulate and chemical contamination into a data storage device housing. It is to such improvements that the claimed invention is directed.

SUMMARY OF THE INVENTION

In accordance with preferred embodiments, a data storage device comprises a housing which supports a rotatable data recording surface and an actuator which controllably moves a data transducing head across the recording surface. A printed circuit board (PCB) provides control electronics for the data storage device, and is preferably mounted to an exterior of the housing.

A flex circuit assembly facilitates electrical communication between the actuator and the printed circuit board. The flex circuit assembly includes a laminated flex circuit and a flex circuit bracket. The flex circuit bracket supports the flex circuit assembly and establishes a diffusion path between the interior of the housing and an external environment to equalize interior and external atmospheric pressures while restricting ingress of contaminants into the interior of the housing.

The flex circuit bracket includes a rigid plate having a diffusion path aperture and opposing exterior and interior surfaces. The flex circuit bracket further includes a laminated flex circuit comprising a flexible, electrically insulative layer which embeds a longitudinally extending, electrically conductive trace.

The flex circuit includes a web portion and an extended portion. The extended portion is configured to form a dynamic loop between the web portion and the actuator. The web portion is affixed to the exterior surface of the plate so that a portion of the web portion extends adjacent the diffusion path aperture to form the diffusion path.

In another preferred embodiment, the plate is characterized as an upper plate and the flex circuit bracket further comprises a second, lower plate with a diffusion path aperture and opposing interior and exterior surfaces. The web portion is attached to the exterior surface of the lower plate, after which the web portion is preferably folded to bring the interior surfaces of the plates into mutual facing alignment and to align the respective diffusion path apertures of the plates. A connector is preferably affixed to the web portion and placed in electrical communication with the electrically conductive trace.

The method for fabricating the flex circuit bracket preferably comprises steps of providing a rigid plate with a diffusion path aperture and opposing interior and exterior surfaces, providing a flex circuit with a web portion and an extended portion, and affixing the web portion of the flex circuit to the exterior surface the plate to form the diffusion path.

Additionally, the method preferably comprises providing a second plate and affixing the web portion to both plates and folding the web portion to align the plates and complete the bracket.

The bracket is preferably mounted to an interior wall of the housing over an aperture through which the connector extends to mate with the disc drive PCB. The diffusion path thus extends from the external environment, through the housing aperture, through the plate(s) and into the interior of the housing. A chemical adsorbent filter can be advantageously placed over the opening so that fluids passing from the bracket diffuse through the filter before moving to the interior of the housing.

These and various other features and advantages which characterize the claimed invention will become apparent upon reading the following detailed description and upon reviewing the associated drawings.

BRIEF DESCRIPTION OF THE DRAWINGS

FIG. 2 provides a top plan view of a flex circuit bracket of the disc drive of FIG. 1, with the bracket in an open position prior to installation.

FIG. 3 provides a top plan view of upper and lower plates of the flex circuit bracket.

FIG. 4 provides a bottom plan view of the upper and lower plates.

FIG. 6 provides an isometric view of a gasket configured to fit about a connector of the flex circuit bracket.

FIG. 7 provides an elevational, cross-sectional view of the flex circuit bracket along line 7—7 in FIG. 1.

FIG. 8 provides an elevational, cross-sectional view of an alternative flex circuit bracket which utilizes a single rigid plate.

FIG. 9 provides a flow chart for a DUAL PLATE FLEX CIRCUIT BRACKET FABRICATION routine, generally illustrative of steps carried out to form and install the flex circuit bracket of FIGS. 1–7 in accordance with preferred embodiments of the present invention.

FIG. 10 provides a flow chart for a SINGLE PLATE FLEX CIRCUIT BRACKET FABRICATION routine, generally illustrative of steps carried out to form and install the flex circuit bracket of FIG. 8 in accordance with preferred embodiments of the present invention.

DETAILED DESCRIPTION

Figure 1:
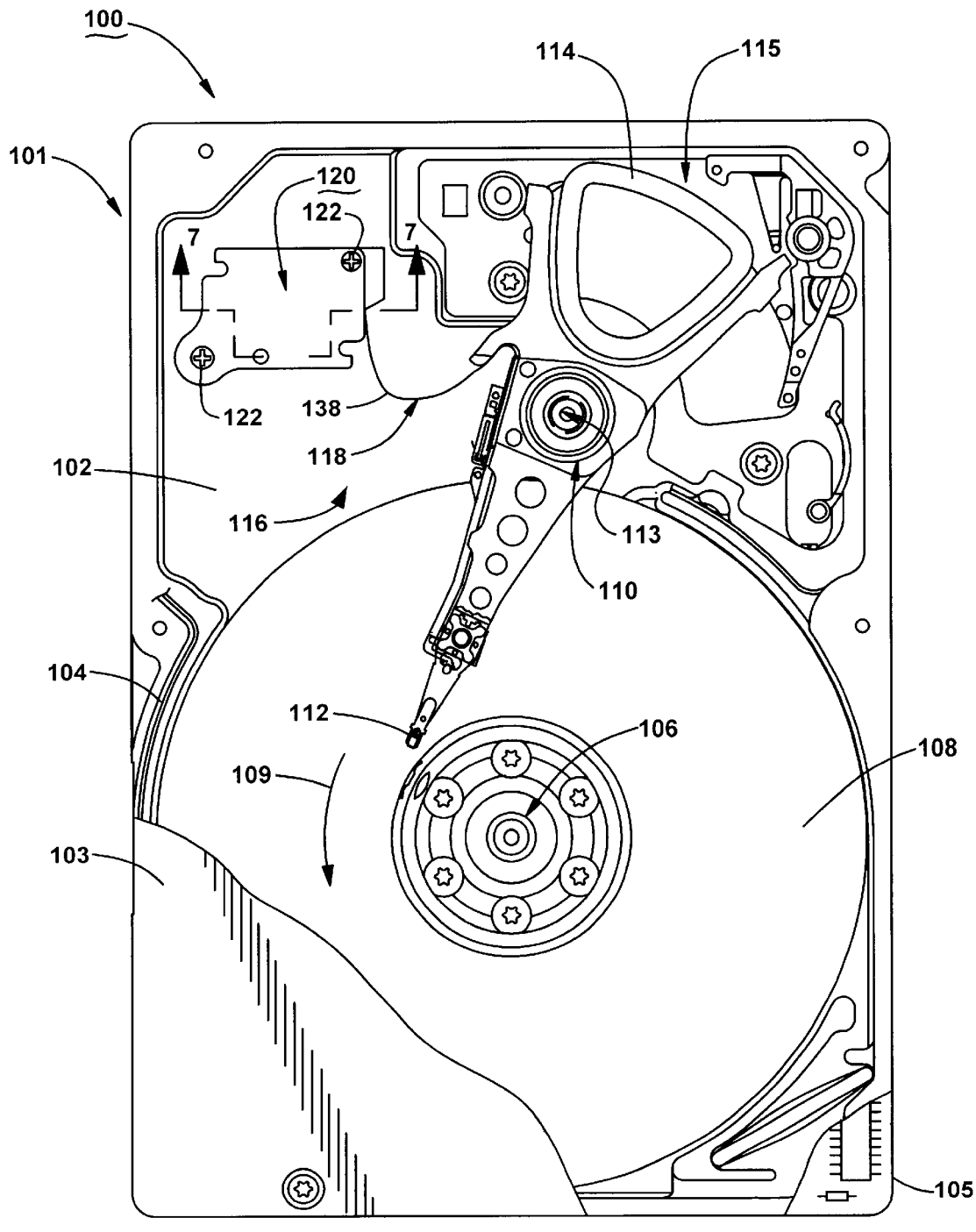
FIG. 1 is a top plan view of a disc drive data storage device constructed in accordance with preferred embodiments of the present invention.

FIG. 1 provides a top plan view of a data storage device constructed in accordance with preferred embodiments of the present invention. The data storage device is preferably characterized as a disc drive 100, although other configurations of data storage devices are readily contemplated.

The disc drive 100 includes a rigid housing 101 which forms an enclosed interior for the drive. The housing 101 is formed from a base deck 102, a top cover 103 and a compressible gasket 104 (the top cover 103 and the gasket 104 are both shown partially cutaway). The gasket 104 extends along the perimeter of the base deck 102 and establishes an effective seal for the housing 101 when the top cover 103 is assembled onto the base deck 102.

Control electronics for the disc drive 100 are supported by a printed circuit board (PCB) 105 mounted to the underside of the base deck 102. The lower right hand corner of the base deck 102 has been removed in FIG. 1 to reveal a portion of the PCB 105.

A spindle motor 106 is supported by the base deck 102 and rotates a number of magnetic recording discs 108 in angular direction 109. A rotary actuator 110 is supported adjacent the discs 108 and includes a corresponding number of data transducing heads 112. The actuator 110 rotates about an actuator axis 113 through application of current to a coil 114 of a voice coil motor (VCM) 115. As the actuator 110 rotates, the heads 112 are moved across the surfaces of the discs 108.

A flex circuit assembly 116 provides electrical communication paths between the actuator 110 and the disc drive PCB 105. The flex circuit assembly 116 includes a flexible, laminated flex circuit 118. The flex circuit 118 preferably comprises opposing sheets of electrically insulative polyester film which embed a number of spaced apart, longitudinally extending electrically conductive traces (conductors). The flex circuit 118 provides the requisite strain relief to permit free rotation of the actuator 110 about the actuator axis 113.

The flex circuit assembly 116 terminates at a flex circuit bracket 120. The flex circuit bracket 120 is mounted to the base deck 102 via fasteners 122. The flex circuit bracket 120 supports the flex circuit assembly 116 and establishes a diffusion path between the interior of the housing 101 and an external environment to equalize interior and external atmospheric pressures while restricting ingress of contaminants into the interior of the housing 101.

FIG. 2 provides a top plan view of the flex circuit bracket 120 prior to installation. It will be noted that the flex circuit bracket 120 in FIG. 2 is in an open position and generally possesses a "butterfly" configuration.

The flex circuit support 120 includes rigid upper and lower plates 124, 126 adjacent the flex circuit 118. FIG. 3 provides a top plan view of the plates 124, 126 to reveal respective exterior surfaces 128, 130. FIG. 4 provides a bottom plan view of the plates 124, 126 to reveal respective interior surfaces 132, 134. The plates 124, 126 are preferably formed from stamped aluminum or other suitable material.

The flex circuit 118 includes a web portion 136 and an extended portion 138. The web portion 136 is shaped to substantially cover the exterior surfaces 128, 130 of the upper and lower plates 124, 126. The extended portion 138 comprises an elongated, ribbon-like extension that forms a dynamic loop between the actuator 110 and the flex circuit bracket 120 (FIG. 1).

Figure 5:
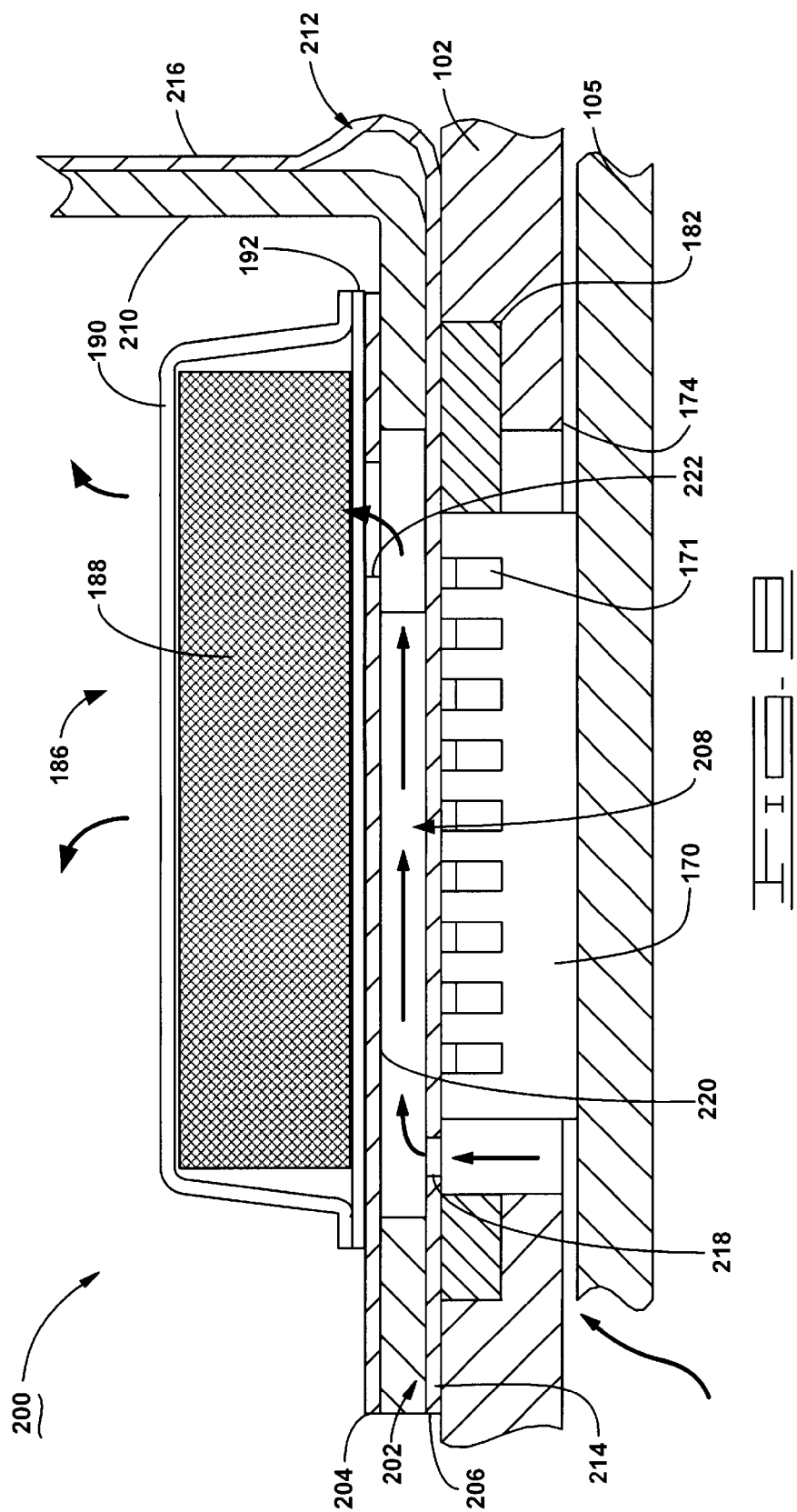
FIG. 5 provides an isometric view of the underside of the flex circuit bracket in a closed (assembled) position prior to installation.

The web portion 136 is preferably affixed to the surfaces 128, 130 using a layer of adhesive (not shown in FIG. 2). A hinge length 140 of the web portion 132 between the plates 124, 126 allows the web portion 132 to be folded over to bring the interior surface 132 of the upper plate 124 into an adjacent facing relationship with the interior surface 134 of the lower plate 126, as shown in FIG. 5.

When folded, fastener apertures 142, 144 in the upper plate 124 align with fastener apertures 146, 148 in the lower plate 126. Fastener apertures 147, 149 are further provided in the web portion 136 (FIG. 2) to align with the fastener apertures 142, 144 in the upper plate. This allows passage of the fasteners 122 through the web portion 136 and the respective plates 124, 126. Alignment features (such as bosses or tabs) are provided as desired to ensure proper alignment of the respective plates 124, 126.

A support member 150 projects from the upper plate 124. The support member 150 includes a support surface 152 to which the extended portion 138 of the flex circuit 11 8 is adhered using a suitable adhesive. The support member 150 is subsequently bent into a substantially vertical alignment, as shown in FIG. 1, to establish one end of the dynamic loop.

The upper and lower plates 124, 126 are further provided with respective diffusion path apertures 154, 155. The aperture 154 in the upper plate 124 comprises a substantially u-shaped, longitudinally extending channel 156 which extends from an inlet chamber area 158 to an intermediary chamber area 160. The aperture 155 in the lower plate 126 comprises a circular-shaped opening of selected diameter. The apertures 154, 156 preferably extend through the entire thicknesses of the respective plates 124, 126.

The intermediary chamber area 160 aligns with the aperture 155 in the lower plate 154 when the plates 124, 126 are mated, thereby defining a diffusion path through the plates. Other shapes and configurations for the diffusion path apertures 154, 155 are readily envisioned, including paths with additional lengths and shapes and paths that only extend partially into the respective plates 124, 126.

The web portion 136 of the flex circuit 118 is provided with web apertures 162, 164 (FIG. 2). When the web portion 136 is affixed to the plates 124, 126, the web aperture 162 aligns with the inlet channel area 158 in the upper plate 124, and the web aperture 164 aligns with the diffusion path aperture 155 in the lower plate 126. In this way, the diffusion path further extends through the web apertures 162, 164. Other portions of the web portion 136 form sidewalls of the diffusion path.

As shown in FIG. 5, a connector 170 is affixed to the web portion 136 and supported by the lower plate 126. The connector 170 includes a number of electrical leads (one denoted at 171) which are soldered to pads on the web portion 136. The electrical leads 171 establish electrical connections with the embedded electrically conductive traces in the flex circuit 118 (one trace is denoted in broken line fashion at 172). The number, size and routing of the embedded traces 172 within the flex circuit 118 will depend upon the requirements of a given application.

The flex circuit bracket 120 further includes a connector gasket 174 which is shown in FIG. 6. The gasket 174 is configured with a central aperture 176 sized to receive and abut the connector 170 when the gasket 174 is placed onto the connector.

A clearance recess 178 extends from the central aperture 176 and provides clearance for the web aperture 164 so that the gasket 174 does not obstruct the diffusion path once installed onto the connector 170. Although FIG. 6 shows the gasket 174 to have a single clearance recess 178, in an alternative preferred embodiment the gasket 174 is provided with opposing recesses 178 on both sides of the central aperture 176. In this way, the diffusion path will remain unobstructed regardless of the orientation of the gasket 174 when the gasket is installed onto the connector 170.

FIG. 7 provides a cross-sectional, elevational representation of the flex circuit bracket 120 to illustrate the diffusion path established once the bracket is installed onto the base deck 102. FIG. 7 generally corresponds to the cross-sectional view along line 7—7 in FIG. 1.

The aforementioned intermediate layer of adhesive used to secure the upper and lower plates 124, 126 is denoted at 180. The connector 170 and gasket 174 are inserted through a bulkhead aperture 182 in the base deck 102 to establish electrical interconnection between the connector 170 with the disc drive PCB 105.

The diffusion path established by the flex circuit bracket 120 passes from the external environment, into the bulkhead aperture 182 and up through the recess 178 in the gasket 174, through the web aperture 164, through the diffusion path aperture 154 in the lower plate 126 and into the intermediary chamber 160.

A suitable aperture 184 is provided through the adhesive layer 180 to allow fluidic communication between the aperture 154 and the chamber 160. The chamber 160 is shaped to collect fluid-borne contaminants that diffuse to this point along the diffusion path.

The diffusion path continues from the intermediary chamber 160, along the channel 156 to the inlet chamber 158. Fluid-borne contaminants that escape the chamber 160 will tend to collect along and adhere to the sidewalls of the channel 158. An adsorbent filter 186 is preferably affixed to the bracket 120 over the inlet chamber 158 so that the fluid diffuses through the filter 186 before passing into the interior of the housing 101. The filter 186 operates to restrict passage of remaining contaminants that reach the filter.

The filter 186 is attached to the bracket 120 using a-thin layer of adhesive (not numerically designated), with an opening to permit flow through the inlet 158. The filter 186 preferably comprises an adsorbent block of media 188 encapsulated in permeable protective layers 190, 192. The media 188 preferably comprises an admixed volume of activated carbon and desiccant silica particles, although other chemically adsorbent materials can be readily used as desired depending upon the requirements of a given application.

The layers 190, 192 are preferably formed from an extruded or expanded porous material such as polypropylene or porous polytetrafluoroethylene (PTFE). The layers can be bonded together to encapsulate the adsorbent media in any number of ways depending upon the requirements of a given application.

FIG. 8 provides an elevational, cross-sectional view of an alternative flex circuit bracket 200 generally similar to the flex circuit bracket 120 discussed above. The flex circuit bracket 200 incorporates several similar components to those of the flex bracket 120 and like reference numerals have been used accordingly.

As with the flex circuit bracket 120, the flex circuit bracket 200 operates to support the flex circuit assembly 116 and to establish a diffusion path between the interior of the housing and an external environment to equalize interior and external atmospheric pressures while restricting ingress of contaminants into the interior of the housing.

The flex circuit bracket 200 utilizes a single rigid plate 202. The plate 202 has a configuration similar to that of the upper plate 124 and includes an exterior surface 204, an interior surface 206, a diffusion path aperture 208 and a support member 210. As before, the diffusion path aperture 208 can take any desired shape within and along the plate 202, and can extend partially or fully through the thickness of the plate 202.

A flex circuit 212 similar to the flex circuit 118 includes a web portion 214 and an extended portion 216. The web portion 214 is attached to the exterior surface 204 of the plate 202 and the extended portion 216 is attached and supported by the support member 210.

As before, the connector 170 is affixed to the web portion 214 and projects through the bulkhead aperture 182 in the base deck 102. The web portion 214 is provided with a web aperture 218 which aligns with the diffusion path aperture 208 so that the diffusion path extends through the web aperture and along the diffusion path aperture. Other portions of the web portion 214 form a sidewall for the diffusion path.

The interior surface 206 of the plate 202 is covered by an insulative layer 220 which forms another sidewall for the diffusion path. The insulative layer 220 can comprise a portion of the web portion 214 (so that the web portion is folded over onto both the interior and exterior surfaces of the plate 202), or the insulative layer can comprise a separate adhesive seal or similar member. The layer 220 includes an aperture 222 to permit flow to the adsorbent filter 186 and on to the interior of the housing 101.

FIG. 9 provides a flow chart for a DUAL PLATE FLEX CIRCUIT BRACKET FABRICATION routine 300, generally illustrative of steps carried out to form and install the dual-plate bracket 120 of FIGS. 1–7 in accordance with preferred embodiments. It will be understood that the routine can be readily employed in a top down, automated assembly environment.

A pair of upper and lower plates (such as the plates 124, 126 discussed herein) are provided at step 302. A flex circuit with a web portion (such as 136) and an extended portion (such as 138) are provided at step 304. The plates and flex circuit include appropriate diffusion path apertures (such as the plate apertures 154, 156 and the web apertures 162, 164 discussed above) to define the requisite diffusion path in the assembled bracket.

The upper and lower plates include exterior surfaces (such as 128, 130 in FIG. 3) which are affixed to the web portion of the flex circuit at step 206 using adhesive or other suitable material. A selected one of the plates preferably includes a support member (such as the member 150), and the extended portion of the flex circuit is also preferably bonded to a surface of the support member at this time. If desired, an adsorbent filter (such as the filter 186) is also installed during this step.

The routine continues at step 308 wherein the web portion is folded to bring interior surfaces of the plates (such as 132, 134) into an adjacent facing relationship (as shown in FIGS. 5, 7). A layer of adhesive (such as 180) is preferably used to secure the plates together. The support member is also preferably bent to the final orientation during this step.

The completed bracket is then installed onto a surface of a housing (such as 101) of a data storage device at step 310. This includes placement of the bracket over an aperture in the housing (such as the bulkhead aperture 182) so that the diffusion path has unblocked clearance to the external environment. When a connector (such as 170) is affixed to the web portion, the connector is preferably extended through the aperture in the housing for mating engagement with a printed circuit board (such as PCB 105).

Finally, the distal end of the extended portion of the flex circuit (opposite the bracket) is affixed to an actuator (such as 110) at step 312, after which the process ends at step 314.

FIG. 10 provides a flow chart for a SINGLE PLATE FLEX CIRCUIT BRACKET FABRICATION routine 400, generally illustrative of steps carried out to form and install the single-plate bracket 200 of FIG. 8 in accordance with preferred embodiments. As with the routine of FIG. 9, the routine 400 readily supports top down, automated assembly environments.

A rigid plate (such as the plate 202) is provided at step 402, and a flex circuit with a web portion (such as 214) and an extended portion (such as 216) are provided at step 404. The plates and flex circuit include appropriate diffusion path apertures (such as 208, 218) to define the requisite diffusion path in the assembled bracket.

The plate includes an exterior surface (such as 204) which is affixed to the web portion 214 at step 406 using adhesive or other suitable material. An insulative layer (such as 220) is affixed to the interior surface (such as 206) of the plate at step 408. An adsorbent filter (such as the filter 186) is also preferably installed during this step.

The routine continues at step 410 where the bracket is installed onto a surface of a housing (such as 101) of a data storage device. This includes placement of the bracket over an aperture in the housing (such as the bulkhead aperture 182) so that the diffusion path has unblocked clearance to the external environment. When a connector (such as 170) is affixed to the web portion, the connector is preferably extended through the aperture in the housing for mating engagement with a printed circuit board (such as PCB 105).

Finally, the distal end of the extended portion of the flex circuit (opposite the bracket) is affixed to an actuator (such as 110) at step 412, after which the process ends at step 414.

The flex circuit bracket embodiments presented herein provide several advantages over the prior art. The brackets 120, 200 are easily and inexpensively fabricated using automated assembly techniques. Incorporation of the diffusion path into the flex circuit bracket eliminates the cost and manufacturing steps associated with providing a separate diffusion path within the housing 101.

Using the bulkhead aperture 182 in the housing 101 to accommodate both the connector 170 and the external diffusion path inlet simplifies the housing 101 design, alleviates potential internal clearance issues, and can improve structural integrity of the housing including reducing acoustic noise generated by vibrations transmitted to the housing by the actuator during high speed seek operations.

It will now be understood that the present invention (as embodied herein and as claimed below) is generally directed to a flex circuit bracket and a method of fabrication thereof for use in a data storage device to support a flex circuit and to establish a diffusion path for the data storage device housing.

In accordance with preferred embodiments, the data storage device comprises a disc drive (such as 100) having a housing (such as 101) which supports a rotatable data recording surface (such as 108) and an actuator (such as 110) which controllably moves a data transducing head (such as 112) across the recording surface. A printed circuit board (such as 105) providing control electronics for the data storage device is preferably mounted to an exterior of the housing.

A flex circuit assembly (such as 116) facilitates electrical communication between the actuator and the printed circuit board. The flex circuit assembly includes a laminated flex circuit (such as 118) and a flex circuit bracket (such as 120, 200) which supports the flex circuit assembly and establishes a diffusion path between the interior of the housing and an external environment to equalize interior and external atmospheric pressures while restricting ingress of contaminants into the interior of the housing.

The flex circuit bracket includes a rigid plate (such as 124, 126, 202) having a diffusion path aperture and opposing exterior and interior surfaces, and a laminated flex circuit (such as 118) comprising a flexible, electrically insulative layer which embeds a longitudinally extending, electrically conductive trace (such as 171). The flex circuit includes a web portion (such as 136, 214) and an extended portion (such as 138, 216). The extended portion is configured to form a dynamic loop between the web portion and the actuator.

The web portion is affixed to the exterior surface of the plate so that a portion of the web portion extends adjacent the diffusion path aperture to form a diffusion path, said diffusion path configured to allow equalization of atmospheric pressure between the interior of the housing and an external environment while restricting ingress of contaminants into the interior of the housing upon attachment of the plate to an interior surface of the housing.

In a preferred embodiment, the plate is characterized as an upper plate (such as 124) and the flex circuit bracket further comprises a lower plate (such as 126). The web portion is further attached to the exterior surface of the lower plate and folded to align the respective diffusion path apertures (154, 156). A connector (such as 170) is affixed to the web portion and placed in electrical communication with the electrically conductive trace.

In accordance with a preferred embodiment, the method for fabricating the flex circuit bracket generally comprises steps of providing a rigid plate (such as by steps 302, 402); providing a flex circuit (such as by steps 304, 404); and affixing a web portion of the flex circuit to the plate (such as by steps 306, 406).

Additionally, the method preferably comprises providing a second plate (step 302) and affixing the web portion to both plates and folding the web portion to align the plates and complete the bracket (step 308).

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application of the flex circuit bracket without departing from the spirit and scope of the present invention.

In addition, although embodiments described herein are directed to a flex circuit bracket for use in a disc drive, it will be appreciated by those skilled in the art that the flex circuit bracket can be readily used in other types of data storage devices including optical disc readers and magneto-optical data storage systems without departing from the spirit and scope of the claimed invention.

What is claimed is:

1. A method for forming a flex circuit bracket for use in a data storage device comprising a housing and a controllably moveable actuator supported within an interior of the housing, the method comprising:

providing a rigid plate having a diffusion path aperture and opposing exterior and interior surfaces;

supplying a laminated flex circuit comprising a flexible, electrically insulative layer which supports a longitudinally extending, electrically conductive trace, the flex circuit having a web portion and an extended portion, the extended portion configured to form a dynamic loop between the web portion and the actuator; and affixing the web portion to the exterior surface of the plate, wherein a portion of the web portion extends adjacent the diffusion path aperture to form a diffusion path to allow equalization of atmospheric pressure between the interior of the housing and an external environment while restricting ingress of contaminants into the interior of the housing upon attachment of the plate to an interior surface of the housing.

2. The method of claim 1, further comprising attaching the plate to the interior surface of the housing over a bulkhead aperture in said housing.

3. The method of claim 2, wherein the supplying step further comprises securing a connector to the web portion in electrical communication with the electrically conductive trace, and wherein the attaching step further comprises inserting the connector through the bulkhead aperture.

4. The method of claim 1, wherein the providing step further comprises providing the plate with a support member and wherein the affixing step further comprises affixing the extended portion of the flex circuit to the support member.

5. The method of claim 1, wherein the plate is characterized as an upper plate, and wherein the method further comprises:

providing a lower plate having a diffusion path aperture and opposing exterior and interior surfaces, and attaching the upper plate to the lower plate so that the interior surface of the upper plate is brought into a facing adjacent relationship with the interior surface of the lower plate and the respective diffusion path apertures of the upper and lower plates are brought into respective fluidic communication.

6. The method of claim 5, wherein the affixing step further comprises affixing the web portion to the exterior surface of the lower plate and folding the web portion to bring the interior surface of the upper plate into the facing adjacent relationship with the interior surface of the lower plate.

7. The method of claim 5, wherein the supplying step further comprises forming web apertures through the web portion which align with the diffusion path apertures of the upper and lower plates so that the diffusion path from the interior of the housing to the external environment further passes through said web apertures.

8. The method of claim 1, further comprising placing an adsorbent filter onto the flex circuit bracket so that the diffusion path from the interior of the housing to the external environment further passes through the adsorbent filter.

9. A flex circuit bracket for use in a data storage device comprising a housing and a controllably moveable actuator supported within an interior of the housing, the flex circuit bracket comprising:

a rigid plate having a diffusion path aperture and opposing exterior and interior surfaces; and a laminated flex circuit comprising a flexible, electrically insulative layer which embeds a longitudinally extending, electrically conductive trace, the flex circuit having a web portion and an extended portion, the extended portion configured to form a dynamic loop between the web portion and the actuator;

wherein the web portion is affixed to the exterior surface of the plate so that a portion of the web portion extends adjacent the diffusion path aperture to form a diffusion path, said diffusion path configured to allow equalization of atmospheric pressure between the interior of the housing and an external environment while restricting ingress of contaminants into the interior of the housing upon attachment of the plate to an interior surface of the housing.

10. The flex circuit bracket of claim 9, further comprising a connector secured to the web portion and in electrical communication with the conductive trace, said conductor configured to mate with a printed circuit board mounted to an exterior surface of the housing.

11. The flex circuit bracket of claim 9, wherein the plate is characterized as an upper plate, and wherein the flex circuit bracket further comprises a lower plate having a diffusion path aperture and opposing exterior and interior surfaces, wherein the upper plate is attached to the lower plate so that the interior surface of the upper plate is brought into a facing adjacent relationship with the interior surface of the lower plate and the respective diffusion path apertures of the upper and lower plates are brought into respective fluidic communication.

12. The flex circuit bracket of claim 11, wherein the web portion is further affixed to the exterior surface of the lower plate, and wherein the web portion is folded to bring the interior surface of the upper plate into the facing adjacent relationship with the interior surface of the lower plate.

13. The flex circuit bracket of claim 9, wherein the web portion comprises a web aperture which aligns with the diffusion path aperture of the plate so that the diffusion path further passes through said web aperture.

14. The flex circuit bracket of claim 9, further comprising an adsorbent filter affixed to the web portion so that the diffusion path further passes through the adsorbent filter.

15. The flex circuit bracket of claim 9, wherein the plate further comprises a support member which supports a proximal end of the extended portion of the flex circuit adjacent the web portion.

16. A data storage device, comprising:

a housing which forms an enclosed interior for the data storage device;

a printed circuit board mounted to an exterior of the housing and providing control electronics for the data storage device;

a rotatable recording surface supported within the housing;

an actuator which controllably moves a data transducing head across the recording surface; and a flex circuit assembly which facilitates electrical communication between the actuator and the printed circuit board, the flex circuit assembly comprising first means for supporting the flex circuit assembly and for establishing a diffusion path between the interior of the housing and an external environment to equalize interior and external atmospheric pressures while restricting ingress of contaminants into the interior of the housing.

17. The data storage device of claim 16, wherein the first means comprises a flex circuit bracket comprising:

a rigid plate having a diffusion path aperture and opposing exterior and interior surfaces; and a laminated flex circuit comprising a flexible, electrically insulative layer which embeds a longitudinally extending, electrically conductive trace, the flex circuit having a web portion and an extended portion, the extended portion configured to form a dynamic loop between the web portion and the actuator;

wherein the web portion is affixed to the exterior surface of the plate so that a portion of the web portion extends adjacent the diffusion path aperture to form the diffusion path.

18. The data storage device of claim 17, wherein the plate is characterized as an upper plate, and wherein the flex circuit bracket further comprises a lower plate having a diffusion path aperture and opposing exterior and interior surfaces, wherein the upper plate is attached to the lower plate so that the interior surface of the upper plate is brought into a facing adjacent relationship with the interior surface of the lower plate and the respective diffusion path apertures of the upper and lower plates are brought into respective fluidic communication.

19. The data storage device of claim 18, wherein the web portion is further affixed to the exterior surface of the lower plate, and wherein the web portion is folded to bring the interior surface of the upper plate into the facing adjacent relationship with the interior surface of the lower plate.

20. The data storage device of claim 17, wherein the web portion comprises a web aperture which aligns with the diffusion path aperture of the plate so that the diffusion path further passes through said web aperture.

* * * * *